United States Patent [19]

Morris

[11] Patent Number: 5,162,763

[45] Date of Patent: Nov. 10, 1992

[54] SINGLE SIDEBAND MODULATOR FOR TRANSLATING BASEBAND SIGNALS TO RADIO FREQUENCY IN SINGLE STAGE

[76] Inventor: Keith D. Morris, R.R. #3, Arnprior, Ontario, Canada, K7S 3G9

[21] Appl. No.: 793,517

[22] Filed: Nov. 18, 1991

[51] Int. Cl.$^5$ .............................................. H03C 1/00
[52] U.S. Cl. ...................................... 332/170; 375/61; 455/109
[58] Field of Search ...................... 332/149, 170, 171; 375/43, 61; 455/47, 109

[56] References Cited

U.S. PATENT DOCUMENTS 4,974,236 11/1990 Gurcan et al. ...................... 332/170
4,994,769 2/1991 Kishi ....................................... 375/61

Primary Examiner—Robert J. Pascal
Attorney, Agent, or Firm—Pascal & Associates

[57] ABSTRACT

A single sideband modulator provides a means of translating low frequency baseband signals directly to radio frequency in a single stage. Such modulators, providing suppressed carrier and one or two of the sidebands, facilitates the transmission of intelligence with significantly increased gain over AM transmission. Control signals are continuously generated to keep the local oscillator breakthrough and image sidebands down to an insignificantly low level. This is achieved by monitoring amplitude of the RF output of the single sideband modulator, and comparing this with the baseband signals. By adjusting the d.c. offsets at the baseband inputs to the balanced modulators, carrier breakthrough is cancelled. By adjusting the relative phases of the baseband signals, deviations from the 90° split are compensated. By changing the amplitude of one of the baseband signals, the level of one of the RF paths is adjusted to achieve amplitude balance.

5 Claims, 3 Drawing Sheets

SINGLE SIDEBAND MODULATOR FOR TRANSLATING BASEBAND SIGNALS TO RADIO FREQUENCY IN SINGLE STAGE

FIELD OF THE INVENTION

This invent relates to radio communication and in particular to a single sideband modulator.

BACKGROUND TO THE INVENTION

A single sideband modulator provides a means of translating low frequency baseband signals directly to radio frequency in a single stage. Such modulators, providing suppressed carrier and one or two of the sidebands, facilitates the transmission of intelligence with significantly increased gain over AM transmission.

A well known way of creating a single sideband signal is to split a low frequency signal carrying intelligence into two identical but 90° phase shifted signals. A radio frequency carrier signal is also split into two separate signals, one having a 90° phase shift relative to the other. One radio frequency and one low frequency component are combined in each of two balanced modulators, the output signals of the modulators being summed. This system acts to suppress the carrier signal, and to provide sidebands, one being balanced out (cancelled) and the other being increased in the combined output.

The low frequency baseband signals can be provided by a digital signal processor and digital-to-analog converters. Signals can be generated this way with precise control over phase and frequency. If the desired signal is digitally generated as two quadrature signals, it can be up-converted by the modulator, with a single local oscillator.

However it has been found that such modulators are limited by several factors:

1. Local oscillator (carrier frequency) breakthrough in the balanced modulators.

2. The phase split of the local oscillator to the two balanced modulators must be precisely 90°. Real phase splitters have their characteristics changed over time, temperature and frequency. The result is incomplete cancellation of the carrier and one sideband.

3. The two, mutually 90° phase shifted carrier signals, when combined, must have the same amplitude. If they do not, incomplete cancellation as noted above occurs. Typically the carrier breakthrough and image sideband levels at the output of the modulator have been found to be between −10 and −20 dBc without careful calibration of the components.

SUMMARY OF THE PRESENT INVENTION

The present invention provides control signals continuously generated to keep the local oscillator breakthrough and image sidebands down to an insignificantly low level. This is achieved by monitoring amplitude of the RF output of the single sideband modulator, and comparing this with the baseband signals. By adjusting the d.c. offsets at the baseband inputs to the balanced modulators, carrier breakthrough is cancelled. By adjusting the relative phases of the baseband signals, deviations from the 90° split are compensated. By changing the amplitude of one of the baseband signals, the level of one of the RF paths is adjusted to achieve amplitude balance.

In accordance with the present invention, a single sideband modulator comprises apparatus for providing in-phase and a quadrature shifted baseband signals, apparatus for modulating the baseband signals with respective in-phase and quadrature shifted local oscillator carrier signals to provide modulated signals, apparatus for summing the modulated signals to provide a single sideband output signal, apparatus for detecting the amplitude of the output signal, and for comparing the amplitude with the baseband signals, apparatus for generating an amplitude balance signal resulting from the comparison and for adjusting the amplitude of one of the baseband signals s as to balance the baseband signal.

In accordance with another embodiment, a a single sideband modulator comprises apparatus for providing in-phase and a quadrature shifted baseband signals, apparatus for modulating the baseband signals with respective in-phase and quadrature shifted local oscillator carrier signals to provide modulated signals, apparatus for summing the modulated signals to provide a single sideband output signal, apparatus for detecting the amplitude of the output signal, and for comparing the amplitude with the baseband signals, apparatus for generating d.c. offset signals resulting from said comparison, and for adjusting d.c. offsets of said modulator apparatus therewith so as to cancel carrier signal breakthrough in the output signal.

In accordance with another embodiment, a single sideband modulator comprises apparatus for providing in-phase and a quadrature shifted baseband signals, apparatus for modulating the baseband signals with respective in-phase and quadrature shifted local oscillator carrier signals to provide modulated signals, apparatus for summing the modulated signals to provide a single sideband output signal, apparatus for detecting the amplitude of the output signal, and for comparing the amplitude with the baseband signals, apparatus for generating a phase offset signal resulting from the comparison, and using the offset signal for adjusting the phase relationship of the baseband signals so as to provide accurate in-phase and quadrature shifted baseband signals.

In accordance with still another embodiment, a single sideband modulator is comprised of a direct digital synthesizer for providing in-phase and quadrature shifted baseband signals, including apparatus for shifting the relative phase of the baseband signals, digital-to-analog converters for converting the baseband signals to analog form, one of the converters including apparatus for varying the amplitude of its output signal, low pass filters for receiving analog output signals of the converters, for limiting the signals to baseband, a pair of balanced modulators for respectively receiving the limited baseband signals and for modulating respective ones of the limited baseband signals with respective in-phase and quadrature shifted local oscillator (carrier) signals to provide a pair of modulated signals, apparatus for summing the modulated signals to provide a single sideband output signal, apparatus for detecting the amplitude of the single sideband output signal, apparatus for comparing the detected amplitude with the limited baseband signals, and for generating d.c. offset, amplitude balance and phase offset control signals, apparatus for applying in-phase and quadrature shifted d.c. offset control signal to respective modulators to reduce carrier breakthrough, for applying the amplitude balance control signals to the one digital-to-analog converter to balance the baseband signals, and for applying the phase offset control signal to a direct digital synthesizer phase control input to the direct digital synthesizer for adjusting the relative phase of the baseband signals to 90°.

Using the present invention, the carrier breakthrough and image sideband levels at the output of the modulator have been reduced significantly, to −55 dBc. Using mixers to generate the correction signals allows higher frequency baseband signals to be processed than using a digital signal processor. For example, a digital signal processor can handle baseband signals up to typically 10 kHz (less than 50 kHz) while the present invention can handle signals several orders of magnitude higher, e.g. 5–10 mHz or higher, and are limited only by the bandwidth of the mixers.

BRIEF INTRODUCTION TO THE DRAWINGS

A better understanding of the invention will be obtained by reference to the detailed description below, in conjunction with the following drawings, in which.

DETAILED DESCRIPTION OF THE INVENTION

Figure 1:
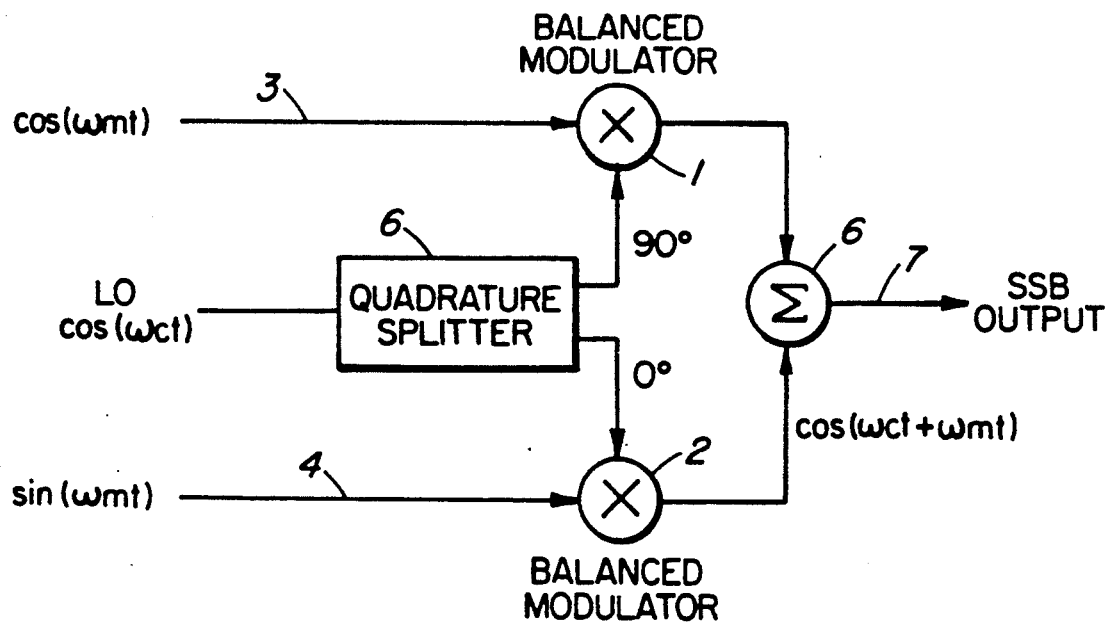
FIG. 1 is a block diagram of a prior art single sideband modulator.

FIG. 1 illustrates a single sideband modulator in accordance with the prior art. Balanced modulators 1 and 2 receive low frequency baseband modulating signals on the lines 3 and 4, relatively phase shifted by 90°, one signal being shown as cos ($\omega mt$) and the other being shown as sin($\omega mt$). The balanced modulators also receive respective local oscillator signals phase shifted by 90° from each other in a quadrature splitter 6, the local oscillator signal being applied to the splitter, and shown as LO cos ($\omega ct$). The outputs of the modulators are combined in a summer 6, providing a single sideband output signal on output line 7, the signal being shown as cos ($\omega ct + \omega mt$).

Figure 2:
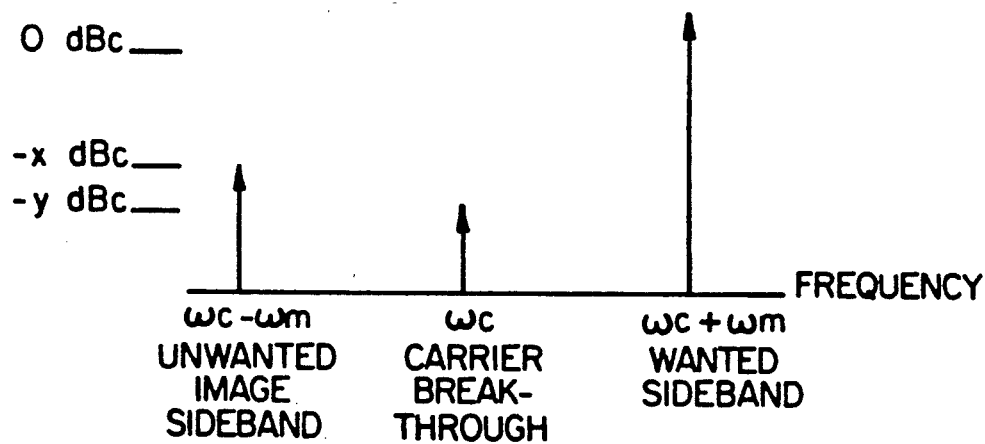
FIG. 2 is a graph in the frequency domain of the energy output of the circuit of FIG. 1.

FIG. 2 illustrates, in the frequency domain, the output signal on line 7, using the circuit of FIG. 1. The carrier frequency at $\omega c$ is shown on line 7 as carrier breakthrough. An unwanted lower image sideband is present, having the frequency of $\omega c - \omega m$. The desired sideband is shown as $\omega c + \omega m$. Clearly the carrier breakthrough $\omega c$ and unwanted lower sideband $\omega c - \omega m$ represents wasted power, interference, and produces other undesirable effects such as jitter.

Figure 3:
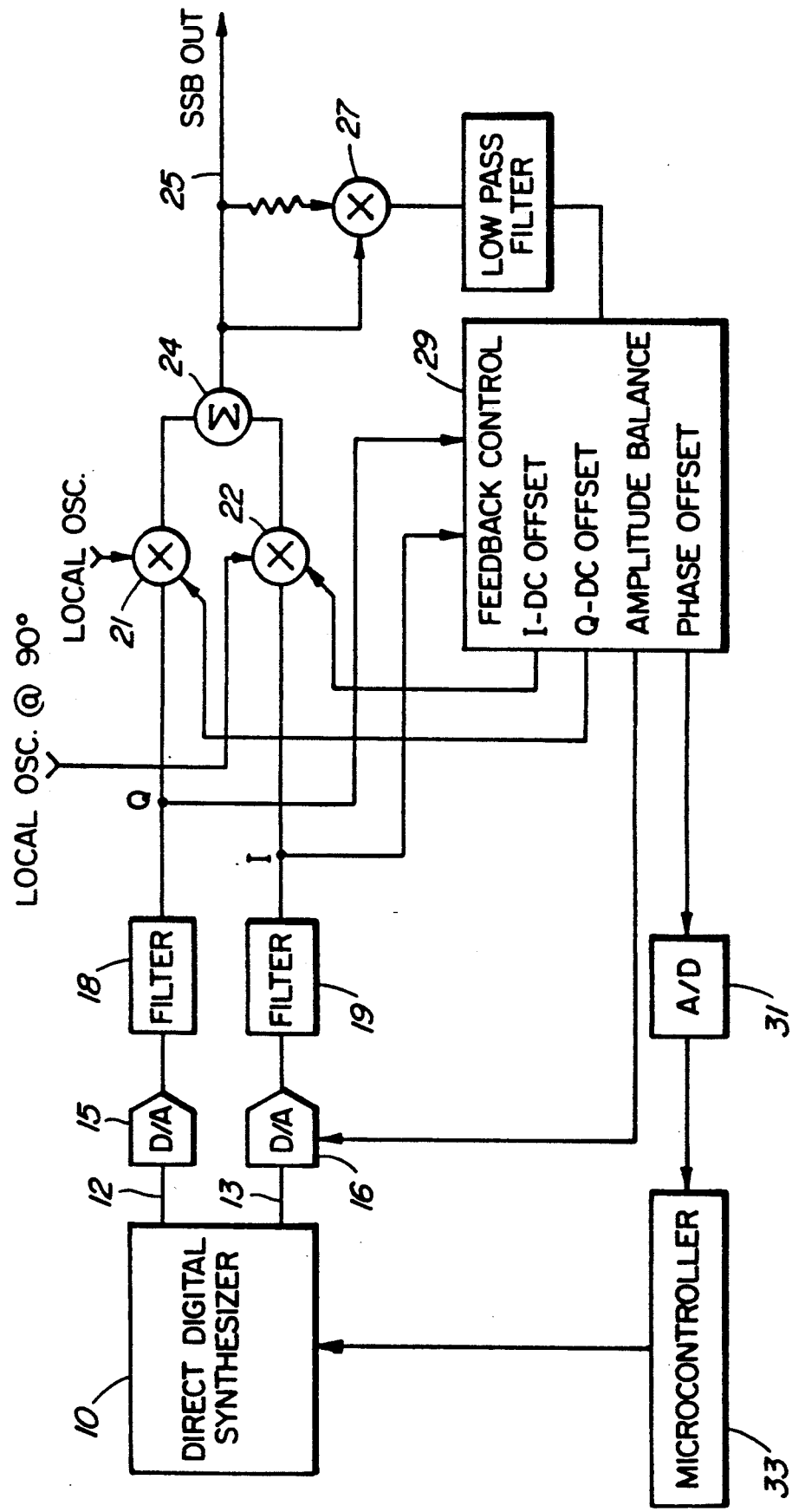
FIG. 3 is a block diagram illustrating the present invention.

FIG. 3 illustrates a block diagram of the present invention. A direct digital synthesizer 10 produces the baseband signals 90° out of phase on lines 12 and 13. These are input to digital-to-analog converters 15 and 16. The outputs of converters 15 and 16 are connected to the inputs of low pass filters 18 and 19, the outputs of which are connected to the inputs of balanced modulators (mixers) 21 and 22. Also input to modulators 21 and 22 are local oscillator carrier signals derived from a single carrier signal, mutually 90° out of phase. The outputs of balanced modulators 21 and 22 are applied to the inputs of a summer 24, the output of which is line 25, carrying the single sideband output signal.

The circuit described so far is known, and is described for instance in the published Application Note entitled "Complex Waveform Generation Using Direct Digital Synthesizer Technique" by Robert P. Gilmore, Engineering Director, QUALCOMM, Inc., particularly in FIG. 6b thereof.

In accordance with the present invention, however, at least one of the digital-to-analog converters 15 or 16 is controllable in respect of its output voltage level. This facilitates equalizing the eventual input signals, from the outputs of low pass filters 18 and 19, into modulators 21 and 22.

In addition, in accordance with the present invention, the DC offsets in modulators 21 and 22 are variable.

The signal sideband output signal is applied to an envelope (amplitude) detector 27. This can be formed by multiplying an attenuated single sideband output signal with single sideband output. The single sideband output signal is rectified. This can be done with a mixer as illustrated or a single diode detector. The local oscillator breakthrough component $\omega c$ appears at the frequency $\omega m$ at the output of detector 27. The image sideband appears at $2\omega m$. These signals are applied to the input of a feedback control circuit 29, with the in-phase and 90° phase shifted and low pass filtered signals at the outputs of filters 18 and 19.

The feedback control circuit 29 provides DC offset signals which are applied to each of the balanced modulators 21 and 22 respectively, an amplitude balance signal which is applied to the amplitude control digital-to-analog converter 16, and a phase offset signal. That signal is applied to analog-to-digital converter 31, the output of which is applied to a microcontroller 33, the output of which is a digital control signal applied to the direct digital synthesizer 10 to adjust the relative phases of the baseband signals on lines 12 and 13.

Thus it may be seen that carrier breakthrough is cancelled by adjusting the DC offsets at the baseband inputs to the balanced modulators 21 and 22. Deviations from the 90° phase split of the baseband signals appearing on lines 12 and 13 are compensated by adjusting the relative phases of the baseband signals, by means of a phase offset signal to the digital synthesizer 10 from the feedback control circuit 29. By means of an amplitude balance output signal of the feedback control circuit 29 applied to digital-to-analog converter 16, the level of the signal carried by one of the RF paths leading to e.g. balanced modulator 22 is adjusted go achieve amplitude balance. This is done by changing the amplitude of the baseband signal by adjusting the output level of the D/A converter 16.

Thus the RF output of the modulator is compared with the baseband signal, and control signals are generated to continuously keep the local oscillator breakthrough and image sideband signals down to a low level, e.g. −55 dBc.

Figure 4:
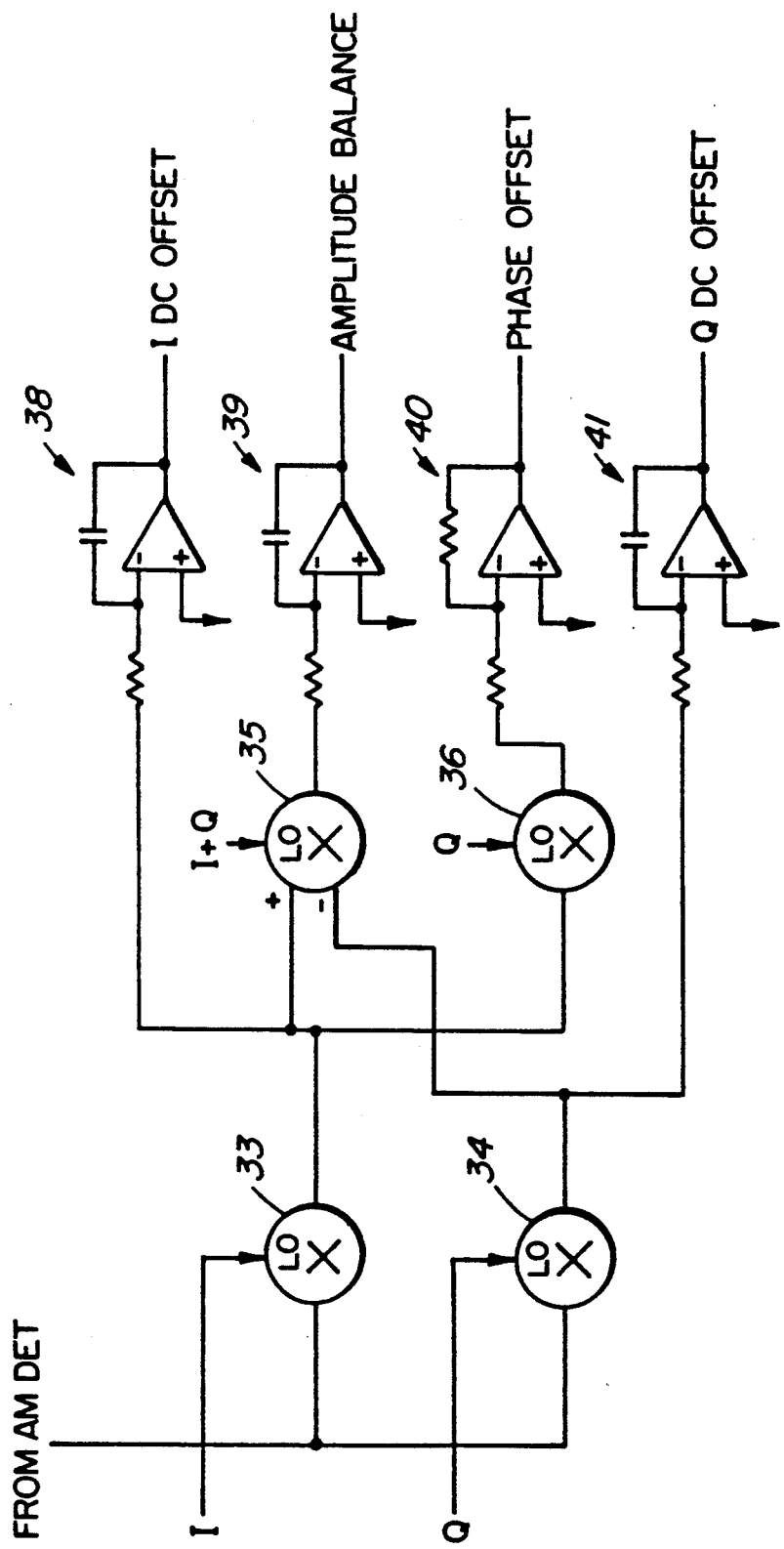
FIG. 4 is a block diagram illustrating in more detail the feedback control circuit of FIG. 3.

A block diagram of the feedback control circuit 29 is illustrated in FIG. 4. The output signal of the amplitude detector 27 is applied to one input of both of mixers 33 and 34. The orthogonal output signals I and Q at the outputs of low pass filters 18 and 19 are respectively applied to second inputs of mixers 33 and 34. The output of mixer 33 is applied to an addition input of mixer 35, and the output of mixer 34 is connected to a subtracting input of mixer 35.

The output of mixer 33 is also connected to an input of a mixer 36.

The in-phase component Q of the output of low pass filter 18 is connected to the other input of mixer 36, and the sum of the in-phase and quadrature shifted signals Q+I, from the outputs of filters 18 and 19 is connected to another input of mixer 35.

The output of mixer 35 is connected to the input of an operational amplifier 38, the output of mixer 35 is connected to the input of operational amplifier 39, the output of mixer 36 is connected to the input of operational amplifier 40, and the output of mixer 34 is connected to the input of operational amplifier 41. These operational amplifiers act as buffers.

As noted earlier, the signals with the unwanted spurious energy are found at $\omega m$ and $2\omega m$, where $\omega m$ is the frequency of the modulating signal. The carrier breakthrough component at $\omega m$ is composed into two quadrature components, one in-phase with the I (in-phase) baseband signal at the output of mixer 33, which corresponds to the local oscillator breakthrough in the inphase channel modulator 22, and the other, at the output of mixer 34, in-phase with the Q (quadrature shifted) baseband signal, corresponding to the local oscillator breakthrough in mixer 21. The low frequency outputs of the two mixers 33 and 34, correlating the amplitude detector 27 output with the I and Q baseband signals, contain the error information needed to drive the inphase and quadrature shifted channel DC offset controls. The output of mixer 33 translated through operational amplifier (buffer) 38, provides the in-phase DC offset signal which is input to modulator 22. The output of mixer 34, translated through operational amplifier (buffer) 41 is the quadrature shifted DC offset signal which is input to modulator 21. The DC offset continuously controls in order to cancel, the carrier breakthrough at the baseband inputs to modulators 21 and 22.

The $2\omega m$ component at the output of amplitude detector 27 is also a composite of two quadrature related signals, one resulting from amplitude inbalance and the other from non-quadrature phase splitting of the local oscillator. This signal appears as an $\omega m$ frequency component at the output of the modulators 21 and 22. The AM detected signals mixed with the in-phase I and quadrature shifted Q baseband signals in mixers 33 and 34 produces the error information needed to drive the amplitude balance and phase offset control. This is effected in mixers 35 and 36, the outputs of which, buffered in operational amplifiers 39 and 40 respectively, provide the amplitude balance signal which is applied to the output amplifier control input of digital-to-analog converter 16, and the phase offset signal which is applied to the input of analog-to-digital converter 31. The amplitude balance signal adjusts the level of the signal at the output of digital-to-analog converter 16 in order to achieve amplitude balance. The phase offset control signal causes microcontroller 33 to adjust the relative phases of the baseband signals generated by the direct digital synthesizer 10.

The direct digital synthesizer can be type Q2334 which is available from QUALCOMM,, Inc. The self-controlled single sideband modulator, combined with the direct digital synthesizer, can be used as a high frequency fine step frequency synthesizer. The frequency resolution and stability of the direct digital synthesizer can be up-converted to the desired radio frequency band by a stable radio frequency source, which could itself be a synthesizer of the described type with a frequency stepping requirement at least twice the maximum frequency generated by the direct digital synthesizer. The radio frequency synthesizer output is applied to the local oscillator inputs of the single sideband modulator as described above. For example, if the direct digital synthesizer can generate frequencies from 0 to $-1$ MHz, the single sideband modulator is able to offset the frequency of the radio frequency source by $\pm 1$ MHz, a total of 2 MHz coverage. To cover a wider band, the radio frequency synthesizer can move in 2 MHz steps.

The direct digital synthesizer could be phase modulated, in addition to providing fine resolution frequency synthesis. As long as the two baseband signals generated by the direct digital synthesizer are kept at 90° offset, plus whatever phase offset is required for calibration, the single sideband modulator will remain calibrated as long as the bandwidth of the modulation is narrow compared to the bandwidth of the quadrature splitter and the local bandpass filters 18 and 19.

A person understanding this invention may now conceive of alternative structures and embodiments or variations of the above using the described principles. All of those which fall within the scope of the claims appended hereto are considered to be part of the present invention.

I claim:

1. A single sideband modulator comprising:
   (a) means for providing in-phase and quadrature shifted baseband signals,
   (b) means for modulating said baseband signals with respective in-phase and quadrature shifted local oscillator carrier signals to provide modulated signals,
   (c) means for summing said modulated signals to provide a single sideband output signal,
   (d) means for detecting the amplitude of the output signal, and for comparing said amplitude with said baseband signals,
   (e) means for generating an amplitude balance signal resulting from said comparison, and for adjusting the amplitude of one of said baseband signals so as to balance said baseband signals,
   said generating means being comprised of a first and a second mixer, means for applying a signal corresponding to the detected amplitude of the output signal to both mixers, means for applying the baseband signals respectively to corresponding ones of said mixers, a further mixer for receiving at a sum input thereof an output signal of the first mixer and for receiving at a difference input an output signal of the second mixer, means for applying the sum of said baseband signals to another input of said further mixer for adding and subtracting respectively with the output signals of the first and second mixers respectively, and means for providing said amplitude balance signal from the output of said further mixer.

2. A single sideband modulator comprising:
   (a) means for providing in-phase and quadrature shifted baseband signals,
   (b) means for modulating said baseband signals with respective in-phase and quadrature shifted local oscillator carrier signals to provide modulated signals,
   (c) means for summing said modulated signals to provide a single sideband output signal,
   (d) means for detecting the amplitude of the output signal, and for comparing said amplitude with said baseband signals,
   (e) means for generating d.c. offset signals resulting from said comparison, and for adjusting d.c. offsets of said modulating means therewith so as to cancel carrier signal breakthrough in said output signal, said generating means being comprised of a first and a second mixer, means for applying a signal corresponding to the detected amplitude of the output signal to both mixers, means for applying the baseband signals respectively to corresponding ones of said mixers, and means for providing said d.c. offset signals from the respective outputs of said mixers.

3. A single sideband modulator comprising:
(a) means for providing in-phase and quadrature shifted baseband signals,
(b) means for modulating said baseband signals with respective in-phase and quadrature shifted local oscillator carrier signals to provide modulated signals,
(c) means for summing said modulated signals to provide a single sideband output signal,
(d) means for detecting the amplitude of the output signal, and for comparing said amplitude with said baseband signals,
(e) means for generating a phase offset signal resulting from said comparison, and using said offset signal for adjusting the phase relationship of said baseband signals so as to provide accurate said in-phase and quadrature shifted baseband signals, said generating means being comprised of a first mixer, means for applying a signal corresponding to the detected amplitude of the output signal to an input of said mixer, means for applying one of the in-phase or quadrature shifted baseband signal to another input of said mixer, another mixer having an input connected to the output of said first mixer, means for applying the other of the in-phase or quadrature shifted baseband signal to another input of said another mixer, and means for providing said phase offset signal from the output of said another mixer.

4. A modulator as defined in claim 1, further comprising:
(f) means for generating d.c. offset signals resulting from said comparison, and for adjusting d.c. offsets of said modulating means therewith so as to cancel carrier signal breakthrough in said output signal,
(g) means for generating a phase offset signal resulting from said comparison, and using said offset signal for adjusting the phase relationship of said baseband signals so as to provide accurate said in-phase and quadrature shifted baseband signals,
(h) means for providing said d.c. offset signals from the respective outputs of said mixers, another mixer having an input connected to the output of said first mixer, means for applying the other of the in-phase or quadrature shifted baseband signal to another input of said another mixer, and means for providing said phase offset signal from the output of said another mixer, a further mixer for receiving at a sum input thereof an output signal of the second mixer, means for applying the sum of said baseband signals to another input of said further mixer for adding and subtracting respectively with the output signals of the first and second mixers respectively, and means for providing said amplitude balance signal from the output of said further mixer.

5. A single sideband modulator comprising:
(a) a direct digital synthesizer for providing in-phase and quadrature shifted baseband signals, including means for shifting the relative phase of said baseband signals,
(b) digital-to-analog converters for converting said baseband signals to analog form, one of said converters including means for varying the amplitude of its output signal,
(c) low pass filters for receiving analog output signals of said converters, for limiting said signals to baseband,
(d) a pair of balanced modulators for respectively receiving said limited baseband signals and for modulating respective ones of said limited baseband signals with respective in-phase and quadrature shifted local oscillator (carrier) signals to provide a pair of modulated signals,
(e) means for summing the modulated signals to provide a single sideband output signal,
(f) means for detecting the amplitude of said single sideband output signal,
(g) means for comparing said detected amplitude with the limited baseband signals, and for generating d.c. offset, amplitude balance and phase offset control signals,
(h) means for applying d.c. offset control signals to respective modulators to reduce carrier breakthrough, for applying the amplitude balance control signals to said one digital-to-analog converter to balance said baseband signals, and for applying the phase offset control signal to a control input of said direct digital synthesizer for adjusting the relative phase of said baseband signals to 90°, and
(i) said generating means being comprised of a first and a second mixer, means for applying a signal corresponding to the detected amplitude of the output signal to both first and second mixers, means for applying the in-phase and quadrature shifted baseband signals respectively to corresponding ones of said mixers, and means for providing said d.c. offset control signals from the respective outputs of said mixers, another mixer having an input connected to the output of said first mixer, means for applying the other of the in-phase or quadrature shifted baseband signal different from the baseband signal applied to said first mixer to another input of said another mixer, and means for providing said phase offset signal from the output of said another mixer, and a further mixer for receiving at a sum input thereof an output signal of the first mixer and for receiving at a difference input an output signal of the second mixer, means for applying the sum of said baseband signals to another input of said further mixer for adding and subtracting respectively with the output signals of the first and second mixers respectively, and means for providing said amplitude balance signal from the output of said further mixer.

* * * * *